United States Patent [19]
Arjavalingam et al.

[11] Patent Number: 5,502,392
[45] Date of Patent: Mar. 26, 1996

[54] METHODS FOR THE MEASUREMENT OF THE FREQUENCY DEPENDENT COMPLEX PROPAGATION MATRIX, IMPEDANCE MATRIX AND ADMITTANCE MATRIX OF COUPLED TRANSMISSION LINES

[75] Inventors: Gnanalingam Arjavalingam, Yorktown Heights; Alina Deutsch, Chappaqua; Gerard V. Kopcsay, Yorktown Heights; James K. Tam, Shrub Oak, all of N.Y.

[73] Assignee: International Business Machines Corporation, Armonk, N.Y.

[21] Appl. No.: 151,595

[22] Filed: Nov. 12, 1993

Related U.S. Application Data

[63] Continuation of Ser. No. 876,956, Apr. 30, 1992, abandoned.
[51] Int. Cl.[6] .................................................... G01R 27/04
[52] U.S. Cl. ..................... 324/638; 324/625; 324/642; 324/628; 324/647
[58] Field of Search .................................. 324/638, 632, 324/642, 647, 648, 628, 625

[56] References Cited

U.S. PATENT DOCUMENTS 3,715,667  2/1973  Nicolson ................................. 324/647

OTHER PUBLICATIONS

G. Arjavalingam et al., "Time–Domain Measurement Of Complex Propagation Constant And Impedance Of Transmission Lines", IBM Tech. Discl. Bull. Vol. 34, No. 7B, Dec. 1991, pp. 429–432.

Frankel, et al. "Terahertz Attenuation And Dispersion Characteristics Of Coplanar Trans. Lines", IEEE Trans. on Micro. Theory & Tech. vol. 39, No. 6, Jun. 1991, pp. 910–915.

D. A. Luce et al., "Time–Domain Measurement Of Loss And Dispersion", IEEE Trans. on Micro. Theory and Tech. Jan. 1976, pp. 50–54.

A. M. Nicolson et al., "Appl. Of Time–Domain Metrology To The Automation Of Broad–Band Micro. Measure.", IEEE Trans. on Micro. Theory and Tech., vol. MIT–20, No. 1, Jan. 1972, pp. 3–9.

A. Deutsch et al., "Characterization Of Resistive Transmission Lines By Short–Pulse Prop." IEEE Micro. and Guided Wave Letter, vol. 2. No. 1, Jan., 1992, pp. 25–27.

(List continued on next page.)

*Primary Examiner*—Kenneth A. Wieder
*Assistant Examiner*—Jose M. Solis
*Attorney, Agent, or Firm*—Daniel P. Morris

[57] ABSTRACT

A method for completely characterizing coupled transmission lines by short-pulse propagation is described. The complex frequency-dependent propagation matrix, impedance matrix and admittance matrix for a set of n parallel transmission lines can be determined by comparing the properties of two sets of coupled transmission lines of different length. Each transmission line set has two conductors of unequal length and ground conductors to form a coupled transmission line system. Each transmission line set can have uncoupled ends. An input pulse is provided at at least one node of each transmission line set. The complex frequency dependent propagation matrix of each transmission line set is determined by a comparison of the output pulses at the remaining nodes of each transmission line set which involves ratioing to cancel out the effect of the pad-to-probe discontinuity and the uncoupled ends which make it unnecessary to do any embedding. For a transmission line wherein the dielectric loss is negligible, the complex frequency dependent characteristic admittance can be determined from the propagation matrix and the empirically determined capacitance matrix. For a transmission line wherein the resistive loss is negligible, the frequency dependent characteristic impedance matrix can be determined from the propagation matrix and the empirically determined inductance matrix. Specific structures are used with the measurement method to determine these coupled transmission line parameters. The method is particularly useful to determine these parameters for transmission lines in semiconductor chip packaging substrates.

29 Claims, 4 Drawing Sheets

OTHER PUBLICATIONS

A. J. Gruodis et al., "Coupled Lossy Transmission Line Characterization And Simulation", IBM J. Res. Develop. vol. 25, No. 1, Jan., 1981, pp. 25–41.

C. S. Chang, "Transmission Lines", Cir. Analysis, Simulation and Design, Advances in CAD for VSLI, vol. 3, Part 2, 1987, pp. 292–332.

A. Deutsch et al., "High–Speed Signal Propagation On Lossy Trans. Lines", J. Res. and Develop., vol. 34, No. 4, Jul. 1990, p. 601–615.

METHODS FOR THE MEASUREMENT OF THE FREQUENCY DEPENDENT COMPLEX PROPAGATION MATRIX, IMPEDANCE MATRIX AND ADMITTANCE MATRIX OF COUPLED TRANSMISSION LINES

This is a continuation of application Ser. No. 07/876,956, filed Apr. 30, 1992 now abandoned.

FIELD OF THE INVENTION

The present invention relates to structures and methods of use thereof for the measurement of the complex frequency dependent propagation matrix and the characteristic impedance matrix and admittance matrix for coupled transmission lines using short pulse propagation techniques. More particularly, the structures are a plurality of sets of parallel conductors wherein each set has a different length. More particularly, each set of transmission lines can be uncoupled ends. More particularly, by ratioing outputs in response to inputs the effects of probe-to-pad discontinuities and uncoupled ends can be eliminated without de-embedding. Most particularly, specific structures are used with the measurement method to determine these coupled transmission line parameters.

BACKGROUND OF THE INVENTION

Circuit-to-circuit interconnections in today's digital computers include on-chip wiring, thin-film or ceramic multichip carriers, and printed circuit boards. In all these cases, it is extremely important to fully characterize these structures since their electrical performance will have a direct impact on the machine cycle time. In most high performance computers, logic signals are propagated over systems of coupled transmission lines. For a large class of these, series resistance is the primary loss mechanism, particular so in the high-density thin-film interconnects currently being investigated. As advances in semiconductor technology continue to decrease the risetimes of signals to be propagated on these structures, their transmission-line characteristics need to be accurately known at higher frequencies. For instance, with a pulse risetime of 50 ps the frequency range of interest is from dc up to about 20 GHz.

Described herein is a simple short-pulse technique for completely characterizing the frequency-dependent electrical properties of transmission lines. High-speed pulse measurements have previously been used for characterizing the transfer functions of microwave antennas and monolithic microwave integrated circuits, the dispersion of microstrips and coplanar striplines and to measure the complex dielectric properties of materials. In the method described here, the measured low-frequency capacitances or inductances and the propagation of high-speed pulses are used to determine the frequency dependent complex propagation matrix, the frequency dependent complex impedance matrix and the frequency dependent complex admittance matrix of a system of coupled transmission lines over a wide frequency range.

The new technique has the following important advantages.

If offers a very simple measurement method for verifying complicated three dimensional models of any system of coupled transmission lines used to connect circuits on chip, on modules, on boards, or between frames.

It uses only the measurement of capacitance and/or inductances and the recording of sets of pulse response waveforms on two similar configurations on the sample under test. It does not need any knowledge of the structure cross section or material characteristics.

The results of the technique can be used directly as inputs to transient circuit analysis programs for wiring performance evaluations. This is extremely useful when three dimensional modelling programs are not available or of limited capability, or the structures are too complicated to be analyzed with standard computing power.

The technique measures the complex frequency dependent propagation matrix, ($\Gamma(f)$) the characteristic impedance matrix, ($Z_0(f)$) and the characteristic admittance matrix. ($Y_0(f)$) over a broad frequency (f) range while many cross sectional modelling programs have serious limitations especially in the transition region between low-to-high frequency of operation.

The technique could be incorporated into any sampling oscilloscope system as a waveform processing tool.

The method is applied to coupled transmission line systems to measure crosstalk on lossy interconnections which is a very difficult task. In this case the mutual capacitances, or mutual inductances, are measured in addition to self-capacitances or self inductances.

This technique can provide feedback about processing influence on material parameters such as dielectric constant; magnitude of loss tangent and its frequency dependence; or metal conductivity all of which determine the functionality of the interconnections.

These and other objects features and advantages will become apparent from the following detailed description and the drawings and claims appended thereto.

SUMMARY OF THE INVENTION

The broadest aspect of the present invention are structures and methods for completely characterizing coupled transmission lines by short-pulse propagation techniques. Using the loss and dispersion of pulses propagated on two different lengths of transmission line sets, the frequency-dependent, complex propagation matrix is determined.

More particularly the present invention is directed to methods for determining the complex frequency dependent propagation matrix, $\Gamma(f)$, of a transmission line of predetermined cross section. A first set of transmission lines of a first length having the predetermined cross section is provided. A second set of transmission lines of a second length having the predetermined cross section is provided. A first input pulse is provided to the first transmission line set. A plurality of outputs from the first transmission line set is monitored. A second input pulse is provided to the second transmission line set. A second plurality of outputs from the second transmission line set is monitored. The first outputs are compared to the second outputs to determine the complex frequency dependent propagation matrix.

In a more particular aspect of the present invention, where the dielectric loss is substantially less than the resistive loss, the complex frequency dependent characteristic admittance matrix is determined from the measured complex frequency dependent propagation matrix and the measured capacitance matrix, in particular, the low frequency capacitance matrix.

In another more particular aspect of the present invention, where the resistive loss is substantially less than the dielectric loss, the complex frequency dependent characteristic impedance matrix is determined from the measured complex frequency dependant propagation matrix and the measured inductance matrix.

DETAILED DESCRIPTION

Figure 1:
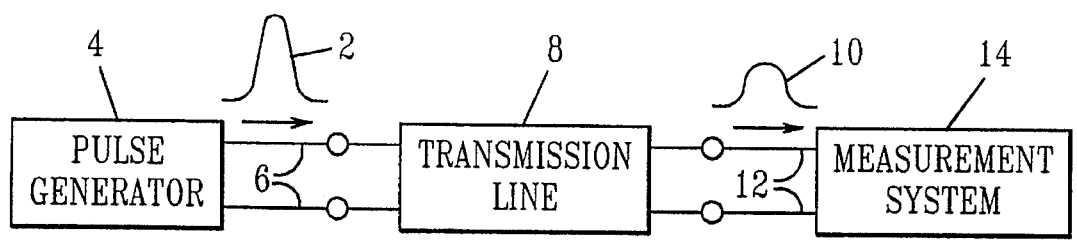
FIG. 1 is a schematic diagram of the characterization set up according to the present invention.

It is explained in A. Deutsch et al., "High-speed signal propagation on lossy transmission lines", IBM J. Res. and Dev., vol. 34, no. 4, pp. 601–615, July, 1990, the teaching of which is incorporated herein by reference that for a uniform transmission line, the differential equations for the line voltage V and current I can be expressed in the frequency domain as follows:

$$\frac{dV}{dx} = -ZI, \tag{1}$$

$$\frac{dI}{dx} = -YV \tag{2}$$

where x is the measurement of distance along the transmission line, $Z=R+j\omega L$ and $Y=G+j\omega C$. R, L, C and G are the line resistance, inductance, capacitance and dielectric conductance per unit length and are in general frequency-dependant. In chip-to-chip package interconnections, a quasi-TEM behavior can be assumed, in which case the general solution to the above equations can be expressed as $$V=V_A e^{-\Gamma x}+V_B e^{\Gamma x} \tag{3}$$

$$I=I_A e^{-\Gamma x}+I_B e^{\Gamma x} \tag{4}$$

where the propagation constant is defined as $\Gamma=\sqrt{ZY}=\sqrt{(R+j\omega L)(G+j\omega C)}$ and the characteristic impedance is $$Z_0=\sqrt{\frac{Z}{Y}}=\sqrt{\frac{R+j\omega L}{G+j\omega C}} \tag{5}$$

$V_A$, $V_B$, $I_A$, and $I_B$ are constants that can be determined by boundary conditions at the two ends of the transmission line. The propagation constant can also be written as $\Gamma=\alpha+j\beta$, where $\alpha=\text{Re}\Gamma$ is the attenuation constant and $\beta=\text{Im}\Gamma$ is the phase constant. Consequently, the key elements that need to be determined for any transmission line are $\alpha$, $\beta$, and $Z_0$.

The usual practice in package characterization until now has been to first measure the line resistance R, and capacitance C. The propagation delay $\tau$, risetime degradation and characteristic impedance are then obtained with a step excitation using both Time-domain Reflectometry (TDR) and Time-domain Transmission (TDT). $Z_0$ is obtained from the magnitude of the step seen on the reflected waveform, while the propagation delay is measured as the time difference between the source and the transmitted signal. Based on the structural dimensions of the transmission line and the materials data (such as dielectric constant, resistivity, and dielectric loss) the cross section of the transmission line is modelled and the frequency-dependent attenuation $\alpha$, phase constant $\beta$, and characteristic impedance $Z_0$ are calculated. The results of these models are then used in simulating pulse propagation with commonly used transient circuit analysis programs. The accuracy of the measured results is limited by the finite risetime of the step, the bandwidth of commercially available sampling oscilloscopes, and of the probing system connecting the source signal to the test pads on the sample being measured. The characteristic impedance $Z_0$ seen at the beginning of the line has to be extracted at the initial voltage step of the waveform which usually has unwanted distortions caused by the probes, and the large separations between signal and ground pads. The propagation delay is generally measured at the 50% level of the waveforms. The accuracy of this measurement is limited by the non-ideal source waveshape, and the risetime dispersion of the propagated waveform on long lossy transmission lines. Because of these effects, it is difficult to extract the actual velocity of propagation and dielectric constant of the insulating material being used. The structure modelling is gated by the accuracy with which the sample cross section and material parameters are known. The resistance and attenuation per unit length are obtained from modelling as a function of frequency. With the procedure described above, no direct verification is available of these results. Instead, their correctness is inferred by comparing simulated waveforms with measured waveforms.

S-parameter measurements can be made in the frequency domain using a network analyzer from which the attenuation, phase and characteristic impedance can be obtained. The accuracy of such a measurement depends on the ability to de-embed the frequency-dependent parasitics introduced by the probing system which are not insignificant, and which especially affect the attenuation results.

In the new method described herein, the complex frequency dependent propagation matrix is measured directly without any prior knowledge of cross-sectional dimensions of the transmission lines. If all the appropriate dimensional data is available, the measured data can be used to verify the models. In this technique, a short electrical pulse is launched onto the transmission line system under test. The source of these pulses could for instance be an electrical pulser, the differentiated risetime of a first step, or an optically excited fast detector. This hardware is readily available.

FIG. 1 shows a schematic representation of the experimental set up used for the measurement technique described herein. A short electrical pulse 2 is launched from a source onto the transmission line system 8 under investigation and the transmitted waveform 10 is transported by conductor 12 to measurement system 14. The source 4 of the pulses 2 could be a pulse generator, the differentiated output of a step generator or a photo-conductive switch, while the measurement system 14 could be an oscilloscope or a photo-conductive sampler. The following articles describe the use of a step generator of a photo-conductive sampler. The following articles describe the use of a step generator or a photo-conductive switch, the teachings of which are incorporated herein by reference: H-L. A. Hung et al. "Millimeter-wave monolithic integrated circuit characterization by a picosecond optoelectronic technique", IEEE Trans. Microwave Theory Tech., vol. 37, pp. 1223–1231; and G. Arjavalingam, Y. Pastol, J-M Halbout and G. V. Kopcsay, "Broadband microwave measurements with transient radiation from optoelectronically pulsed antennas", IEEE Trans. Microwave Theory Tech., vol. 38, pp. 615–621, May 1990.

For the results discussed herein, with reference to FIGS. 2–8, we used the 40-ps wide pulses obtained by differentiating the step source of a 20-GHz sampling oscilloscope (HP model 54120A). A commercially available passive impulse-forming network (Picosecond Pulse Labs model 5210) was used as the differentiator and custom high-speed probes were used to electrically connect the experimental apparatus to planar transmission lines. Custom high speed probes are described in, the teaching of which is incorporated herein by reference, V. A. Ranieri, A. Deutsch, G. V. Kopcsay and G. Arjavalingam, "A novel 24-GHz bandwidth coaxially probe", IEEE Trans. Instrum. Measure., vol. 39, pp 504–507, June 1990. Commercially available connectors were used for connectors 6 and 12 of FIG. 1.

The results described herein can be extended in many way. The frequency coverage can be increased with the use of shorter pulses and a higher-time-resolution measurement system. The technique is applied to the measurement of coupled noise (crosstalk) to obtain the transfer function of an N-port network.

Figure 2:
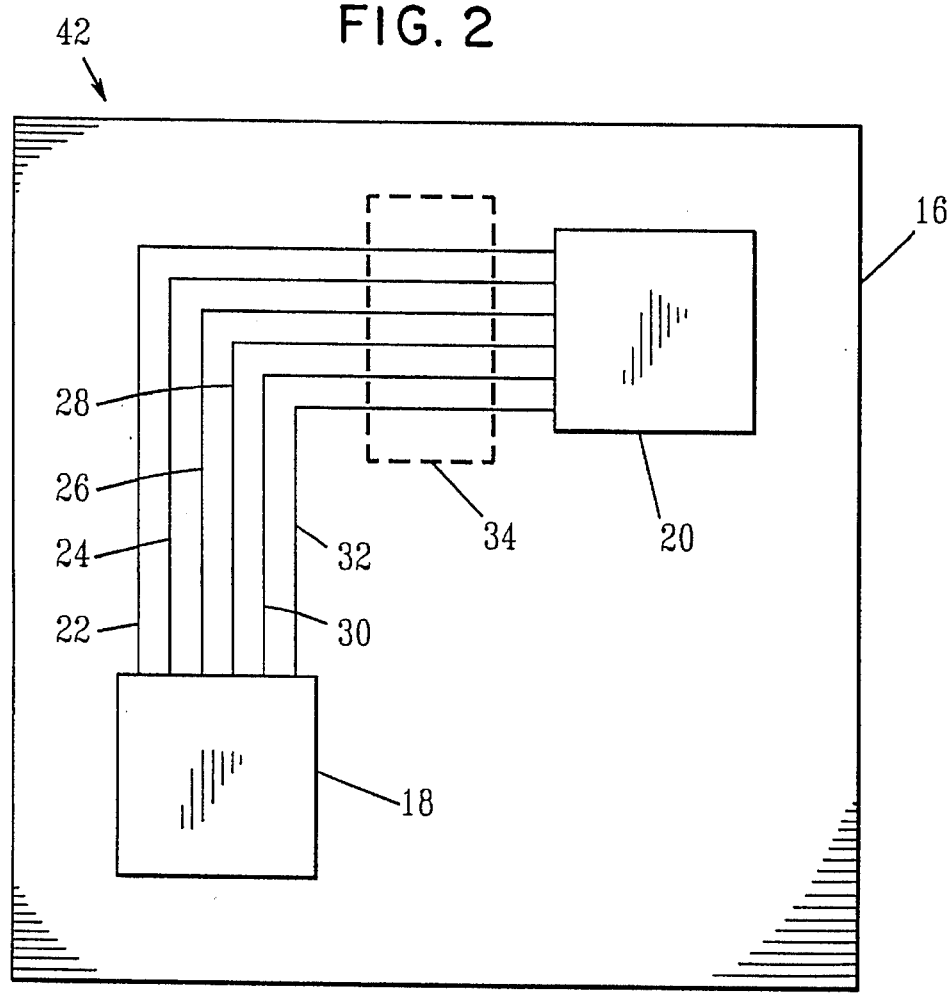
FIG. 2 shows a schematic top view of a packaging structure with two integrated circuit chips electrically interconnected by coupled transmission lines.

FIG. 2 shows a schematic top view of an example of a packaging structure 42 having a substrate 16 with integrated circuit chips 18 and 20 mounted thereon. Chips 18 and 20 are electrically interconnected by a plurality of conductors 22, 24, 26, 28, 30 and 32. Although six conductors are shown, there can be any number n of theses conductors.

Figure 3:
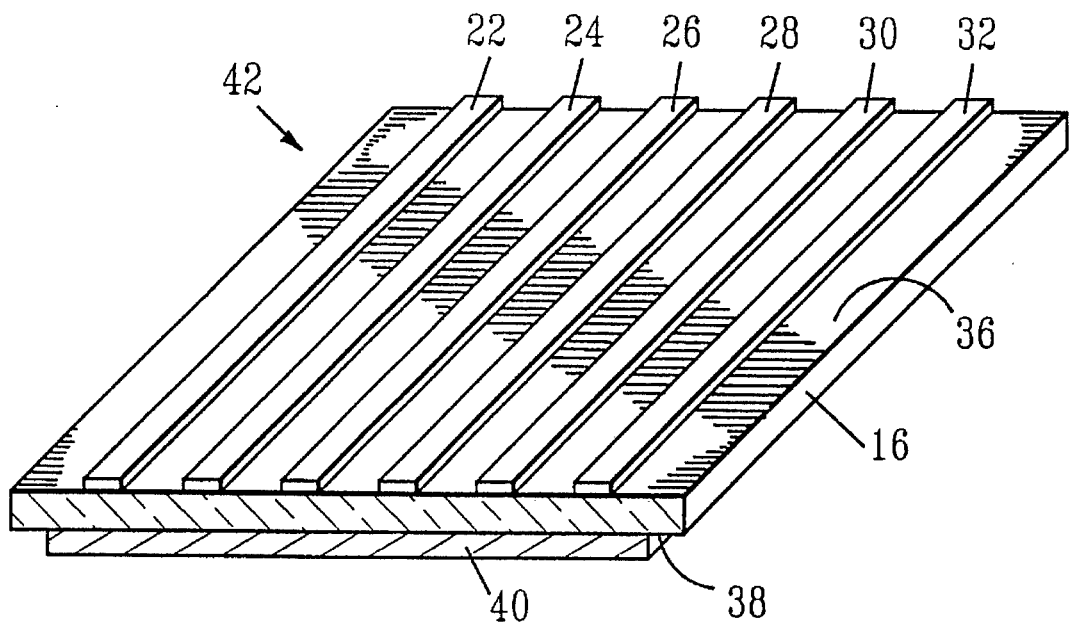
FIG. 3 shows, is perspective, a section of the structure of FIG. 2 bounded by rectangle 34 of FIG. 2.

FIG. 3 shows in perspective the section of structure 42 of FIG. 2 bounded by dashed rectangle 34. Numerals common between FIGS. 1 and 2 represent the same thing. The conductors 22 to 32 are one side 36 of substrate 16. On the opposite side 38 of substrate 16 there is a ground plane 40. The section of structure 42 bounded by rectangle 34 has a top and bottom level of metallization with a dielectric 16 therebetween. Structure 42 can have any number of levels of metallization with dielectric layers there between. FIGS. 2 and 3 are exemplary only, other configurations of signal and ground conductors are relevant packaging structures which can be measured by the methods of the present invention.

The methods and structures of the present invention permit the determination of n×n frequency dependent complex propagation matrix, impedance matrix and admittance matrix for a group of conductors such as shown in FIG. 3.

The differential equations (1) and (2) can be extended to systems of n-transmission lines, where V and I become n-dimensional vectors of the line voltages and currents as described in A. J. Gruodis and C. S. Chang, "Coupled Lossy Transmission Line Characterization and Simulation", IBM J. Res. Develop., vol. 25, pp. 25–41, 1981, the teaching of which is incorporated herein by reference. (Bold face type represents vectors and matrices):

$$\frac{dV}{dx} = -ZI \quad (6)$$

$$\frac{dI}{dx} = -YV \quad (7)$$

In this case, Z and Y are n×n symmetric matrices, with frequency-dependent real and imaginary parts, $Z=R+j\omega L$ and $Y=G+j\omega C$, where R, L, G, and C are also n×n symmetric matrices. It is shown in C. S. Chang, "Transmission Lines", Advances in CAD for VLSI, 3, Part II, Circuit Analysis, Simulation and Design, A. E. Ruehli, Ed., North-Holland Publishing Co., Amsterdam, 1987, pp. 292–332, the teaching of which is incorporated herein by reference, if the ZY product has distance eigenvalues, it can be reduced to a diagonal matrix, and the propagation and characteristic admittance matrices can be expressed as:

$$\Gamma \equiv \sqrt{ZY} = P\sqrt{\gamma}\,P^{-1} \quad (8)$$

$$Y_0 = Y\Gamma^{-1} = Z^{-1}\Gamma \quad (9)$$

where P is the eigenvector matrix of $\Gamma$ and $\sqrt{\gamma}$ is the n×n diagonal eigenvalue matrix of the product ZY. Once $\Gamma$ and $Y_0$ are determined, V(x) and I(x) are fully characterized since:

$$V(x) = e^{-\Gamma x}V_+ + e^{\Gamma x}V_- \quad (10)$$

$$I(x) = Y_0(e^{-\Theta x}V_+ - e^{\Gamma x}V_-)Y_0 \quad (11)$$

where $V_+$ and $V_-$ are constant voltage vectors that can be determined from boundary conditions at the two ends of the lines. It is shown in Deutsch et al., July, 1990, incorporated herein by reference above, that the general practice is to calculate the frequency-dependent R, L, G, and C matrices for the transmission line structure using complex three dimensional modelling techniques. Based on this, $\Gamma$ and $Y_0$ are calculated and used to solve for V and I, and thus model signal propagation and crosstalk. Even with powerful simulation tools, however, inaccuracies can occur in predicting coupled noise. This is especially true of far-end crosstalk or forward coupling which requires the calculation of small differences between the eigenvalues of $\Gamma$. It should be noted that both the cross sectional and lossy coupled line transient analysis tools are of limited availability in industry, require a high degree of expertise for accurate broadband analysis, and are, in general extremely CPU-intensive.

An alternative approach, according to the invention herein is to measure $\Gamma$ and $Y_0$ matrices and use them directly to solve for V and I. Such a technique is greatly simplified if one considers the special case of only two symmetrical coupled lines. A system of uniform n-conductor lines can be analyzed as a linear superposition of m-pairs of coupled conductors (m=n−1), as described in C. S. Chang et al. "Crosstalk in Multilayer Ceramic Packaging" Proceeding of Symposium on Circuits and Systems, Vol. 1, pp 6–10, (1981), the etching of which is incorporated herein by reference. Preferably, as described hereinbelow, the outputs of a first and second transmission line set are compared. Each set, preferably, has the same cross sectional dimensions.

For the two-line symmetrical case the eigenvector matrix of P of $\Gamma$ is independent of frequency:

$$P = P^{-1} = \frac{1}{\sqrt{2}} \begin{pmatrix} 1 & 1 \\ 1 & -1 \end{pmatrix} \quad (12)$$

In this special case, the eigenvalue matrix is given by $$\gamma(f) = \begin{pmatrix} \gamma_e(f) & 0 \\ 0 & \gamma_o(f) \end{pmatrix} \quad (13)$$

where $y_e$ and $y_o$ are the complex propagation constants of the even and odd modes associated with electromagnetic wave propagation in a symmetrical two-line structure.

In most practical digital applications, dielectric losses are small or resistive losses dominate. In such cases then, $G \approx 0$ and $Y = j\omega C$, and we can determine the characteristic admittance or impedance matrix as follows:

$$Y_0(f) = j\omega C\Gamma^{-1} \quad (14.1)$$

$$Z_0(f) = \Gamma(j\omega C)^{-1} \quad (14.2)$$

In the case where the resistive losses are small and dielectric losses dominate a different set of equations apply. This situation can occur where the conductors are superconductors. In such cases, $R \approx 0$ and $Z = j\omega L$, and we can determine the characteristic impedance or admittance matrix as follows:

$$Z_0(f) = j\omega \Gamma^{-1} L \tag{15.1}$$

$$Y_0(f) = (j\omega L)^{-1} \Gamma \tag{15.2}$$

Figure 4:
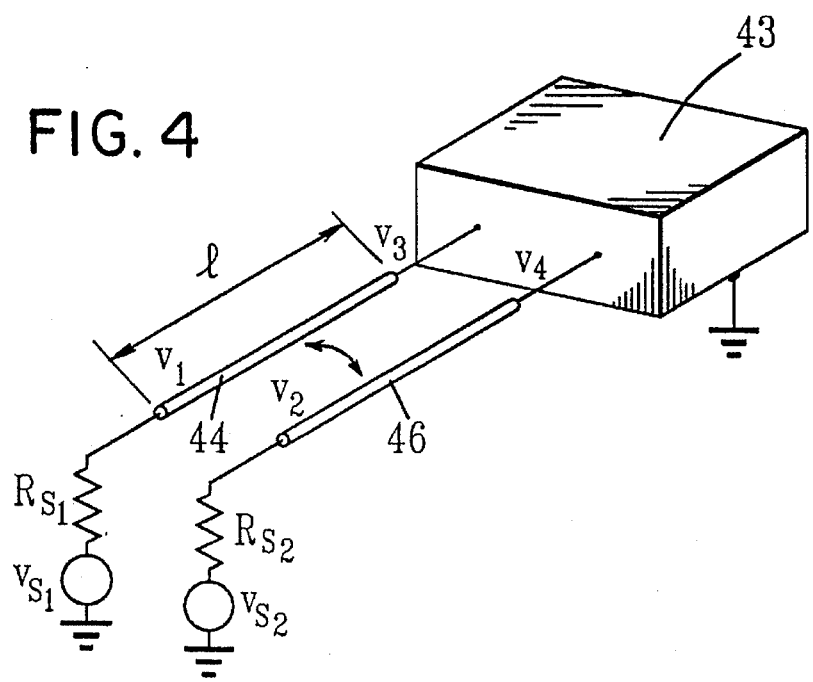
FIG. 4 shows two transmission lines of length 1 driven by different sources.

For the two lines 44 and 46 of length l considered in FIG. 4, driven by sources $v_{s1}$, $v_{s2}$ and having source resistance $R_{S1}$ and $R_{S2}$, respectively, and terminated with their characteristic impedance $Z_0$, 43, to eliminate reflections, the input voltage $V_{in}$ and output voltage $V_{out}$ can be expressed as:

$$V_{in} = Z_0(Z_S + Z_0)^{-1} V_S \tag{16}$$

$$V_{out} = e^{-\Gamma l} V_{in} \tag{17}$$

where $$V_{in} = \begin{pmatrix} v_1 \\ v_2 \end{pmatrix}, V_{out} = \begin{pmatrix} v_3 \\ v_4 \end{pmatrix}, Z_s = \begin{pmatrix} R_{s_1} & 0 \\ 0 & R_{s_2} \end{pmatrix}, V_s = \begin{pmatrix} v_{s_1} \\ v_{s_2} \end{pmatrix} \tag{18}$$

From (8), (12) and (13) $\Gamma$ can be expressed in terms of the odd and even modes of propagation as:

$$\Gamma(f) = \frac{1}{2} \begin{pmatrix} \gamma_e + \gamma_o & \gamma_e - \gamma_o \\ \gamma_e - \gamma_o & \gamma_e + \gamma_o \end{pmatrix} \tag{19}$$

and (17) becomes $$V_{out} = \begin{pmatrix} v_3 \\ v_4 \end{pmatrix} = P \begin{pmatrix} e^{-\gamma_e l} & 0 \\ 0 & e^{-\gamma_o l} \end{pmatrix} P^{-1} V_{in} \tag{20}$$

or $$\begin{pmatrix} v_3 + v_4 \\ v_3 - v_4 \end{pmatrix} = \begin{pmatrix} e^{-\gamma_e l} & 0 \\ 0 & e^{-\gamma_o l} \end{pmatrix} \begin{pmatrix} v_1 + v_2 \\ v_1 - v_2 \end{pmatrix} \tag{21}$$

or in a condensed format:

$$v_3 \pm v_4 = e^{-\gamma_{e,o} l}(v_1 \pm v_2) \tag{22}$$

from which $$\gamma_{e,o}(f) = -\frac{1}{l} \ln \frac{v_3 \pm v_4}{v_1 \pm v_2} \tag{23}$$

Once the complex eigenvalues $y_{e,o}$ are obtained from (23), we can calculate $\Gamma$ using equation (19). For the case where $G \cong 0$, by measuring the self and mutual capacitances for the two symmetric lines and substituting into (14.1) and (14.2) $Y_0$ and $Z_0$ are determined and the lossy coupled transmission lines are fully characterized. For the case where $R \cong 0$, by measuring the self and mutual inductances for the two symmetric lines and substituting into (15.1) and (15.2) $Z_0$ and $Y_0$ are determined and the coupled transmission lines are fully characterized.

The thrust of the invention is a simple technique for experimentally determining the $\Gamma$, $Y_0$ and $Z_0$ matrices.

Figure 5:
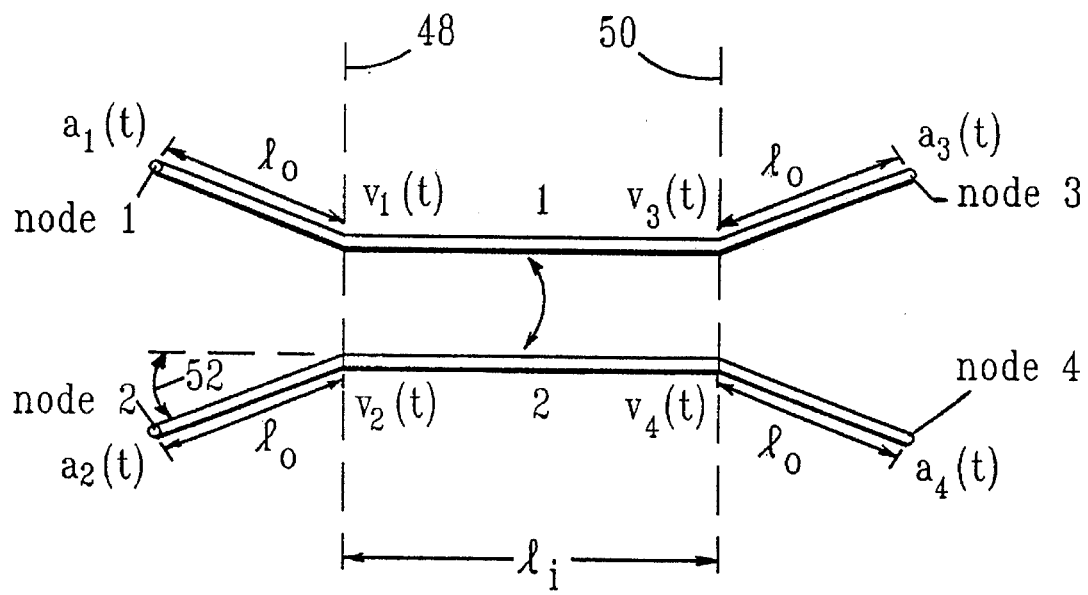
FIG. 5 shows a schematic diagram of a transmission line uncoupled flared ends.
Figure 6:
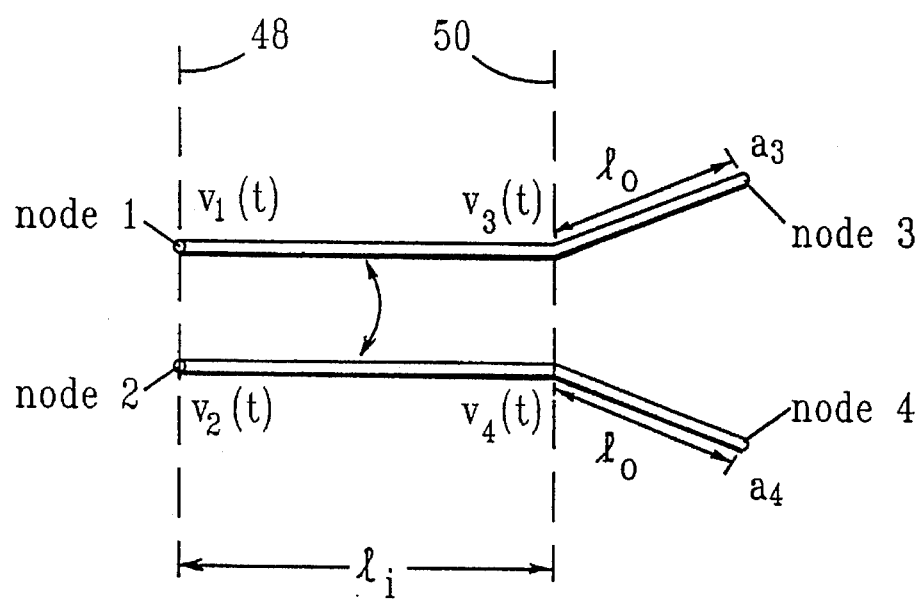
FIG. 6 shows transmission lines similar to that of FIG. 5 with the uncoupled lines eliminated at the source end.

In this invention, we propose a simple technique for the unambiguous measurement of the propagation matrix $\Gamma$, and the impedance and admittance matrices $Z_0$ and $Y_0$. To perform the characterization a special sample configuration, as schematically shown in FIG. 5, is designed and fabricated. It consists of a central section, between dashed lines 48 and 50, of the coupled lines to be characterized which has a length $l_i$. Transmission lines sections, to the left of dashed line 48 and to the right of dashed line 50, with negligible coupling to other lines, are connected to each end of the central section and terminate at probing pads marked as nodes 1 through 4 in FIG. 5. The length $l_0$ of these identical uncoupled sections are chosen so that reflections caused by probe-to-pad discontinuities and the impedance discontinuity between is dated and coupled-line sections are well separated in time from the primary signals of interest. The uncoupled sections are preferably straight making an angle 52 with respect to the straight coupled portion. Angle 52 is large enough to ensure negligible coupling. Other shapes, such as curved shapes, are also suitable. Measurements are carried out with two sets of otherwise identical designs except with the central section having lengths $l_1$ and $l_2$, where $l_1 < l_2$.

A short electrical pulse is launched into the structure at node 1, and the output waveforms at nodes 2, 3 and 4 are recorded with a suitable measurement system (e.g. an oscilloscope). The pulse width must be shorter than the propagation delay on the coupled sections of the lines. For example, the voltage waveforms at node 2 corresponding to coupled section lengths $l_1$ and $l_2$ are designated $a_2^1(t)$ and $a_2^2(t)$, respectively. In this convention, the subscript refers to the node, and the superscript to the central-section length. Similarly, the time-domain waveforms at nodes 3 and 4 are $a_3^1(t)$, $a_3^2(t)$, $a_4^1(t)$ and $a_4^2(t)$.

The signal at node 3 is the transmitted pulse, while the signals at nodes 2 and 4 are due to near-end coupling and far-end coupling, respectively. Since secondary reflections are well separated in time and can be eliminated by time windowing, the primary signals of interest, at the source ends of the lines, $V_{in}$, are independent of length as shown by equation (16).

The measured time-dependent signals $a_3^1$, $a_3^2$, $a_4^1$ and $a_4^2$ are numerically Fourier transformed to obtain their complex spectra $A_3^1$, $A_3^2$, $A_4^1$, and $A_4^2$, respectively. Any unwanted reflections due to mismatches in impedance and pad-to-probe effects are eliminated, by time windowing from the time-domain waveforms prior to the Fourier transform step. Numerical fast Fourier transforms are described, for example, in "Digital Signal Analysis" by S. D. Stearns, Hayden Publications, the teaching of which is incorporated herein by reference.

Since the effect of the uncoupled-line sections are (to the left of dashed line 48 and to the right of dashed line 50) the same for all nodes, and because $a_1^1 = a_1^2$, and $a_2^1 = a_2^2$, equation (23) can be expressed as $$\gamma_{e,o}(f) = -\frac{1}{l_1 - l_2} \ln \frac{A_3^1(f) \pm A_4^1(f)}{A_3^2(f) \pm A_4^2(f)} \tag{24}$$

The effect of the pad-to-probe discontinuity in the measured signal and also the effect of the uncoupled sections which are substantially identical in both sets of measurements linearly cancel out in this ratio making it unnecessary to do any de-embedding (see appendix). The real part of the eigenvalues $y_{e,o}$ are obtained from the amplitudes of the Fourier transforms, while the imaginary parts are obtained from the net phase of the Fourier transform. Equation (8) together with the eigenvector matrix P defined by (12) are then used to obtain the complex propagation matrix $\Gamma$.

In cases where resistive losses dominate and dielectric losses are negligible, the low-frequency self, $C_{11}$, $C_{22}$ and mutual capacitances per unit length $C_{12}$, $C_{21}$ are then measured to obtain the capacitance matrix C. For the symmetrical-line case, $C_{11} = C_{22}$ and $C_{12} = C_{21}$, and so $$C = \begin{pmatrix} C_{11} & -C_{12} \\ -C_{12} & C_{11} \end{pmatrix} \tag{25}$$

is easily obtained experimentally. The matrix together with the experimentally determined $\Gamma$ matrix are then used to obtain the admittance matrix $Y_0$ and the impedance matrix $Z_0$ with equation (14.1) and (14.2).

Similarly, when resistive losses are negligible and dielectric losses dominate, the low frequency self, $L_{11}$, $L_{22}$ inductances and mutual inductances per unit length $L_{12}$, $L_{21}$, are measured to obtain the inductance matrix L. For the symmetrical-line case, $L_{11}=L_{22}$ and $L_{12}=L_{21}$, and so $$L = \begin{pmatrix} L_{11} L_{12} \\ L_{12} L_{11} \end{pmatrix} \quad (25.2)$$

is easily obtained experimentally. This matrix together with the experimentally determined $\Gamma$ matrix are then used to obtain the characteristic impedance, $Z_0$, and admittance $Y_0$ using equations (15.1) and (15.2).

The configuration shown in FIG. 5, with input signals only applied to node 1, is the simplest experimentally while being theoretically manageable. As a special case, the uncoupled lines may be eliminated at the source end to save space, resulting in the configuration shown in FIG. 6 with node 2 shorted to ground ($v_2$=0). The procedure is the same as discussed above, however, in this case the NEN (near end noise) signal reflected from node 2 is explicitly measured at node 4. The grounding connection might not always be implementable in some package configurations.

Figure 7:
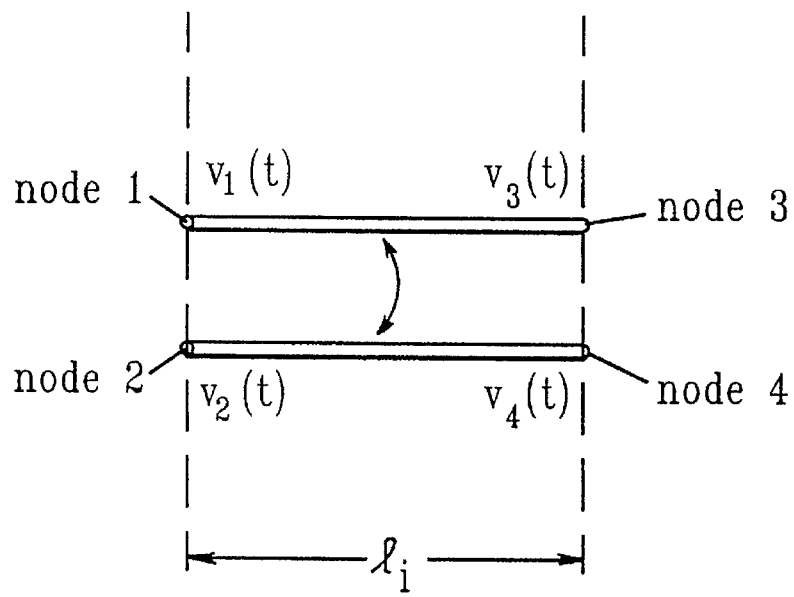
FIG. 7 shows the more general case of the structures of FIGS. 5 and 6.

A more general case would be the configuration shown in FIG. 7 which can easily be accommodated on any package interconnection structure. In this case, however, in order to maintain the simple theoretical formulation of equations (16) and (17), the experimental procedure becomes much more complicated. Identical short-pulse sources ($v_1$, $v_2$) have to be applied to nodes 1 and 2 while identical probe-detector arrangements are attached to nodes 3 and 4 for waveform extraction. The signals $v_3$ and $v_4$ are recorded first with $v_2=+v_1$ and then with $v_2=-v_1$ (by inverting $v_2$). In the former case, $v_3=v_4$, and in the latter, $v_3=-v_4$ which can be checked experimentally. The procedure is repeated with two different lengths of $l_i$($l_1$, $l_2$ where $l_1<l_2$). In this case the measured voltages are $v_3^{1\pm}(t)$, $v_3^{2\pm}(t)$ where the subscript 3 refers to node 3, the superscripts 1, 2 refer to line lengths $l_1$, $l_2$. The superscript + and − refer to the condition when $v_1=v_2$ (same magnitude and polarity) and $v_2=-v_1$ (opposite magnitude and polarity), respectively. In this case Eq. (18) reduces to $$\gamma_{e,o} = -\frac{1}{l_1 - l_2} \ln \frac{V_3^{1\pm}(f)}{V_3^{2\pm}(f)} \quad (26)$$

where $V_3^{1\pm}(f)$ and $V_3^{2\pm}(f)$ are the complex Fourier transforms of $v_3^{1\pm}(t)$ and $v_3^{2\pm}(t)$, respectively.

While this last configuration may be difficult to implement with conventional electrical equipment, it is more feasible with photoconductive pulse generators and detectors where control of amplitude and timing is more precise.

The use of time windowing and the ratioing of the two Fourier transforms enables the simple approach presented.

The special layout proposed as the preferred one (FIG. 5) provides simple experimental and theoretical implementation but more general layouts can be handled as well.

The technique provides $\Gamma$ and $Y_0$ matrices over a board frequency range where many cross-sectional modelling programs have serious limitations, especially in the transition between low-frequencies to high-frequencies where skin effects plays a role, and in three-dimensional configurations.

The approach was presented for two coupled lines, but can be extended to n-conductor systems by linear superpositions. Such a case would be applicable for most digital interconnection structures that have fairly weak coupling and are uniform. The restriction of negligible dielectric losses, $G\cong 0$, (which is used for determining $Y_0$ and $Z_0$), is reasonable since most common insulators used in semiconductor chip packaging applications have low dielectric loss, especially compacted with resistive losses.

It is to be understood that the above described embodiments are examples of the principles of the invention. Various other modifications and changes may be devised by those skilled in the art which will embody the principles of the invention and fall within the spirit and scope thereof.

APPENDIX

Figure 8:
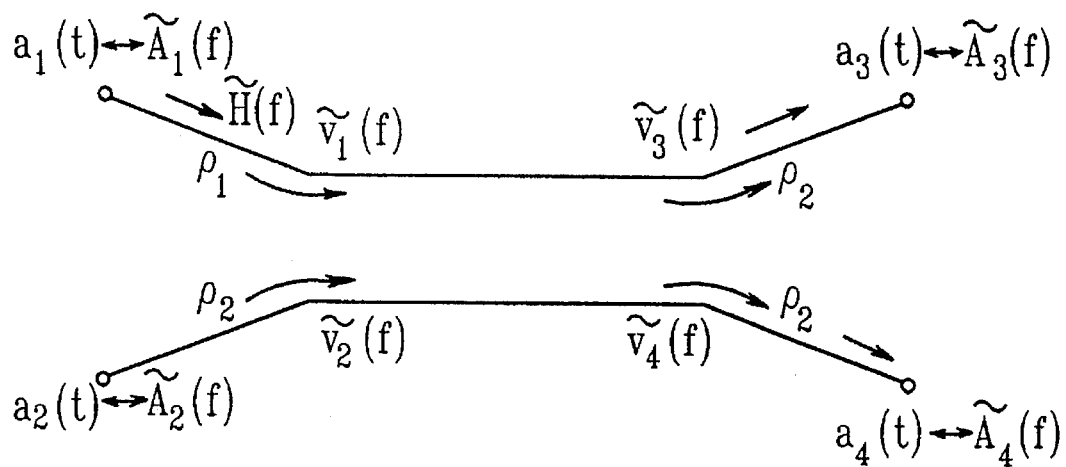
FIG. 8 is the same as FIG. 5 with matrices indicated thereon.

This derivation is with reference to FIG. 8. The symbol "~" over a quantity indicates a complex function and "*" indicates complex multiplication.

$\tilde{H}_0(f)$ is pad-to-probe transfer function $\tilde{H}_1(f)$ is probe-to-pad transfer function $\tilde{H}(f)$ is propagation transfer function of single uncoupled section.

$\tilde{P}_1(f)$ is uncoupled-line to coupled-line interface transfer function.

$\tilde{P}_2(f)$ is coupled-line to uncoupled-line transfer function.

$$\tilde{V}_i(f) = (1+\tilde{P}_1(f))*\tilde{H}(f)*\tilde{H}_1(f)*\tilde{A}_i(f)$$

$$\tilde{A}_3(f) = \tilde{H}_0(f)*\tilde{H}(f)*(1+\tilde{P}_2(f))*\tilde{V}_3(f)$$

$$\tilde{A}_4(f) = \tilde{H}_0(f)*i\,\tilde{H}(f)*(1+\tilde{P}_2(f))*\tilde{V}_4(f)$$

$$\tilde{A}_2(f) = \tilde{H}_0(f)*\tilde{H}(f)*(1+\tilde{P}_2(f))*\tilde{V}_2(f)$$

Since transmission is a product operation in the frequency domain.

$$\frac{\tilde{A}_3^1(f) \pm \tilde{A}_4^1(f)}{\tilde{A}_3^2(f) \pm \tilde{A}_4^2(f)} = \frac{\tilde{H}_0(f)*\tilde{H}(f)*(1+\tilde{p}_2(f))*\{\tilde{V}_3^1(f) \pm \tilde{V}_4^1(f)\}}{\tilde{H}_0(f)*\tilde{H}(f)*(1+\tilde{p}_2(f))*\{\tilde{V}_3^2(f) \pm \tilde{V}_4^2(f)\}} \quad (4)$$

$$= \frac{\tilde{V}_3^1(f) \pm \tilde{V}_4^1(f)}{\tilde{V}_3^2(f) \pm \tilde{V}_4^2(f)}$$

Therefore Eq (24) follows from Eq (23).

We claim:

1. A method for determining the complex frequency dependent propagation matrix, $\Gamma(f)$, of a transmission line of predetermined cross section comprising:

providing a first transmission line set of a first length $l_1$, having said predetermined cross section;

providing a second transmission line set of a second length $l_2$ having said predetermined cross section, wherein $l_1 \neq l_2$;

providing a first input pulse to said first transmission line set;

monitoring a plurality of outputs from said first transmission line set;

providing a second input pulse to said second transmission line set;

monitoring a second plurality of outputs from said second transmission line set; and comparing said first outputs to said second outputs to determine said complex frequency dependent propagation matrix.

2. The method of claim 1, further including:

measuring the capacitance matrix of at least one of said first transmission line set and said second transmission line set; and comparing said complex frequency dependent propagation matrix with said capacitance matrix to determine a complex frequency dependant admittance matrix for said first and said second transmission line sets.

3. The method of claim 2, further including:

measuring the inductance matrix of at least one of said first transmission line set and said second transmission line set; and comparing said complex frequency dependent propagation matrix with said inductance matrix to determine a complex frequency dependent impedance matrix for said first and said second transmission line sets.

4. The method of claim 1, further including the complex frequency dependent propagation matrix for a set of n coupled transmission lines wherein $n \geq 2$.

5. The method of claim 1, wherein said first input pulse is substantially the same as said second input pulse.

6. The method of claim 1, wherein each of said first and said second transmission line sets has at least a portion which is coupled.

7. The method of claim 1, wherein each of said first and said second transmission line sets comprises a set of two coupled transmission lines with a common ground conductor and four nodes.

8. The method of claim 7, wherein said first input pulse is applied to one of said four nodes of said first transmission line set, wherein said second input pulse is applied to one of said four nodes of said second transmission line set, said plurality of outputs at the remainder of said four nodes of said first transmission line set and said second transmission line set being monitored.

9. The method of claim 1, further including determining a first set of Fourier transforms of said first plurality of outputs, determining a second set of Fourier transforms of said second plurality of outputs to determine said complex frequency dependent propagation matrix.

10. The method of claim 7, wherein each of said two transmission lines comprise two substantially parallel conductors, wherein each of said two coupled transmission lines has a first node, a second node, a third node and a fourth node, wherein said first and second nodes are adjacent, wherein said third and fourth nodes are adjacent, further including, determining the complex frequency dependent Fourier transform of said first plurality of outputs at said third and fourth nodes and at said second plurality of outputs at said third and fourth nodes which are represented by: $A_3^1$, $A_3^2$, $A_4^1$, and $A_4^2$, respectively; and wherein said complex frequency dependent propagation matrix, $\Gamma(f)$, is determined from:

$$\Gamma(f) = \frac{1}{2} \begin{pmatrix} \gamma_e + \gamma_o & \gamma_e - \gamma_o \\ \gamma_e - \gamma_o & \gamma_e + \gamma_o \end{pmatrix}$$

wherein, $$\gamma_e(f) = -\frac{1}{l_1 - l_2} \ln \frac{A_3^1(f) + A_4^1(f)}{A_3^2(f) + A_4^2(f)}$$

$$\gamma_o(f) = -\frac{1}{l_1 - l_2} \ln \frac{A_3^1(f) - A_4^1(f)}{A_3^2(f) - A_4^2(f)}$$

11. The method of claim 6, wherein each of said first and second transmission line sets comprises a set of coupled transmission lines having a plurality of substantially parallel conductors spaced a distance apart, each of said conductors has a first and second end, said first ends being adjacent, said second ends being adjacent, at at least one of said adjacent first and second ends there being substantially uncoupled transmission line portions terminating in electrical contact locations.

12. The method of claim 11, wherein said uncoupled transmission line portions have a spacial separation varying from said distance at said adjacent first and second ends to a larger spacial separation at said contact locations.

13. The method of claim 11, wherein said uncoupled transmission line portions are substantially straight and at a nonzero angle with respect to said substantially parallel conductors.

14. The method of claim 7, wherein at least one of said four nodes of at least one of said first and said second transmission line sets is grounded.

15. The method of claim 14, wherein said first and said second transmission line sets further include an uncoupled transmission line portion at one end thereof.

16. The method of claim 7, wherein said two transmission lines comprise two substantially parallel conductors having a first node, a second node, a third node and a fourth node, wherein said first node and said second node are adjacent and wherein said third node and said fourth node are adjacent, wherein said first input pulse is applied to said first node of said first transmission line set and wherein another input pulse substantially identical to said first input pulse is applied substantially simultaneously to said second node of said first transmission line set, wherein said second input pulse is applied to said first node of said second transmission line set and wherein another input pulse substantially identical to said second input pulse is applied substantially simultaneously to said second node of said second transmission line st, said first plurality of outputs being monitored at said third and fourth nodes of said first transmission line set and said second plurality of outputs being monitored at said third and fourth nodes of said second transmission line set.

17. The method of claim 7, wherein first and said second transmission line set comprises a dielectric layer having a first side and a second side, there being a first and a second substantially parallel conductors disposed on said first side and a conducting plane disposed on said second side.

18. The method of claim 1, wherein said first and said second plurality of outputs are monitored using time windowing.

19. The method of claim 2, wherein said complex frequency dependent admittance matrix is represented by:

$$Y(f) = j\omega C$$

wherein C is the capacitance matrix of said first and said second transmission line sets.

20. The method of claim 19, wherein the characteristic admittance and the characteristic impedance of said first or said second transmission line sets are represented by:

$$Y_0(f) = j\omega C \Gamma^{-1}$$

$$Z_0(f) = \Gamma(j\omega C)^{-1}$$

respectively.

21. The method of claim 3, wherein said complex frequency dependent impedance matrix is represented by:

$$Z(f) = j\omega L$$

wherein L is the inductance matrix of said first and said second transmission line set.

22. The method of claim 19, wherein the characteristic impedance and admittance of said first and second transmission line set are represented by:

$$Z_o(f) = j\omega \Gamma^{-1} L$$

$$Y_o(f) = (j\omega L)^{-1} \Gamma$$

respectively.

23. The method of claim 2, wherein for said first and said second transmission line sets, the dielectric losses are negligible and resistive losses dominate.

24. The method of claim 3, wherein for said first and said second transmission line sets, the resistive losses are negligible and dielectric losses dominate.

25. The method of claim 1, wherein said comparing is ratioing said first and said second plurality of outputs.

26. The method of claim 1, wherein said first transmission line set and said second transmission line set have substantially the same cross section.

27. A method for determining the complex frequency dependent propagation matrix, $\Gamma(f)$, of a transmission line of predetermined cross section comprising:

providing a first transmission line set of a first length $l_1$, having said predetermined cross section;

providing a second transmission line set of a second length $l_2$, having said predetermined cross section;

said first transmission line set and said second transmission line set having a first and second substantially parallel conductor and a ground conductor, said first conductor, said second conductor and said ground conductor forming a coupled transmission line set, each of said first conductor and said second conductor has a first and second end, said first end of said first conductor being adjacent said first end of said second conductor, said second end of said first conductor being adjacent said second end of said second conductor, at said adjacent first and second ends there being substantially uncoupled transmission line portions terminating in a first node, a second node, a third node and a fourth node;

providing a first input pulse to said first one of said first transmission line set;

monitoring a first plurality of outputs from said third node and said fourth node of said first transmission line set;

providing a second input pulse to said first node of said second transmission line set;

monitoring a second plurality of outputs from said third node and said fourth node of said second transmission line set;

determining the complex frequency dependent Fourier transform of said first plurality of outputs at said third and fourth nodes and at said second plurality of outputs at said third and fourth nodes which are represented by: $A_3^1$, $A_3^2$, $A_4^1$, and $A_4^2$, respectively; and wherein said complex frequency dependent propagation matrix, $\Gamma(f)$, is determined from:

$$\Gamma(f) = \frac{1}{2} \begin{pmatrix} \gamma_e + \gamma_o & \gamma_e - \gamma_o \\ \gamma_e - \gamma_o & \gamma_e + \gamma_o \end{pmatrix}$$

wherein, $$\gamma_e(f) = -\frac{1}{l_1 - l_2} \ln \frac{A_3^1(f) + A_4^1(f)}{A_3^2(f) + A_4^2(f)}$$

$$\gamma_o(f) = -\frac{1}{l_1 - l_2} \ln \frac{A_3^1(f) - A_4^1(f)}{A_3^2(f) - A_4^2(f)}$$

28. A method for determining the complex frequency dependent propagation matrix, $\Gamma(f)$, of a transmission line of predetermined cross section comprising:

providing a first transmission line set of a first length $l_1$ having said predetermined cross section;

providing a second transmission line set of a second length $l_2$ having said predetermined cross section, said first transmission line set and said second transmission line set having a first and second substantially parallel conductor and having a ground conductor, said first conductor, said second conductor and said a ground conductor, forming a coupled transmission line, each of said first conductor and said second conductor has a first and second end, said first end of said first conductor being adjacent said fist end of said second conductor, said second end of said first conductor being adjacent said second end of said second conductor, at said second ends there being substantially uncoupled transmission line portions terminating in a third node and a fourth node, said first end of said first conductor being said first node, said first end of said second conductor being said second node;

providing a first input pulse to said first node of said first transmission line set;

grounding said second node of said first transmission line set;

monitoring a first plurality of outputs from said third node and said fourth node of said first transmission line set;

providing a second input pulse to said first node of said second transmission line set;

grounding said second node of said second transmission line;

monitoring a second plurality of outputs from said third node and said fourth node of said second transmission line set;

determining the complex frequency dependent Fourier transform of said first plurality of outputs at said third and fourth nodes and of said second plurality of outputs at said third and fourth nodes which are represented by: $A_3^1$, $A_3^2$, $A_4^1$, and $A_4^2$, respectively; and wherein said complex frequency dependent propagation matrix, $\Gamma(f)$, is determined from:

$$\Gamma(f) = \frac{1}{2} \begin{pmatrix} \gamma_e + \gamma_o & \gamma_e - \gamma_o \\ \gamma_e - \gamma_o & \gamma_e + \gamma_o \end{pmatrix}$$

wherein, $$\gamma_e(f) = -\frac{1}{l_1 - l_2} \ln \frac{A_3^1(f) + A_4^1(f)}{A_3^2(f) + A_4^2(f)}$$

$$\gamma_o(f) = -\frac{1}{l_1 - l_2} \ln \frac{A_3^1(f) - A_4^1(f)}{A_3^2(f) - A_4^2(f)}$$

29. A method for determining the complex frequency dependent propagation matrix, $\Gamma(f)$, of a transmission line of predetermined cross section comprising:

providing a first transmission line set of a first length $l_1$ having said predetermined cross section;

providing a second transmission line set of a second length $l_2$ having said predetermined cross section;

said first transmission line set and said second transmission line set having a first and second substantially parallel conductor and having a ground conductor, said first conductor, said second conductor and said a ground conductor, forming a coupled transmission line, each of said first conductor and said second conductor has a first and second end, said first end of said first conductor being adjacent said fist end of said second conductor, said second end of said first conductor being adjacent said second end of said second conductor, said first and second ends of said first conductor being a first and third node, said first and second end of said second conductor being a second and fourth node;

providing a first input pulse to said first node of said first transmission line set;

providing a second input pulse to said second node of said first transmission line set;

said first and said second input pulses having substantially the same magnitude and polarity;

monitoring a first output in response to said first and said second input pulses at said third node or said fourth node of said first transmission line set;

providing a third input pulse to said first node of said first transmission line set;

providing a fourth input pulse to said second node of said first transmission line set;

said third and said fourth input pulses having substantially the same magnitude and opposite polarity;

monitoring a second output from said third node or said fourth node of said first transmission line set;

providing a fifth input pulse to said first node of said second transmission line set;

providing a sixth input pulse to said second node of said second transmission line set;

said fifth and said sixth input pulses having substantially the same magnitude and polarity;

monitoring a third output in response to said fifth and said sixth input pulses at said third or said fourth node of said second transmission line set;

providing a seventh input pulse to said first node of said second transmission line set;

providing an eighth input pulse to said second node of said second transmission line set;

said seventh and said eight input pulses having substantially the same magnitude and opposite polarity;

monitoring a fourth output from said third node or said fourth node of said second transmission line;

determining the complex frequency dependent Fourier transform matrices of said first output, said second output, said third output and said fourth outputs which are represented by, $V^{1-}$ (f), $V^{1-}$ (f), $V^{2+}$ (f) and $V^{2-}$ (f) respectively; and wherein said complex frequency dependent propagation matrix, $\Gamma$ (f), is determined from:

$$\Gamma(f) = \frac{1}{2} \begin{pmatrix} \gamma_e + \gamma_o & \gamma_e - \gamma_o \\ \gamma_e - \gamma_o & \gamma_e + \gamma_o \end{pmatrix}$$

wherein, $$\gamma_e(f) = -\frac{1}{l_1 - l_2} \ln \frac{V^{1\pm}(f)}{V^{2\pm}(f)}$$

$$\gamma_o(f) = -\frac{1}{l_1 - l_2} \ln \frac{V^{1-}(f)}{V^{2-}(f)}$$

* * * * *